United States Patent
Hille et al.

(10) Patent No.: US 7,880,200 B2
(45) Date of Patent: Feb. 1, 2011

(54) SEMICONDUCTOR DEVICE INCLUDING A FREE WHEELING DIODE

(75) Inventors: Frank Hille, Munich (DE); Carsten Schaeffer, Annenheim (AT); Frank Pfirsch, Munich (DE); Holger Ruething, Munich (DE)

(73) Assignee: Infineon Technologies Austria AG, Villach (AT)

( * ) Notice: Subject to any disclaimer, the term of this patent is extended or adjusted under 35 U.S.C. 154(b) by 87 days.

(21) Appl. No.: 11/864,238

(22) Filed: Sep. 28, 2007

(65) Prior Publication Data

US 2009/0085103 A1  Apr. 2, 2009

(51) Int. Cl.
*H01L 29/732* (2006.01)
(52) U.S. Cl. .............................. 257/197; 257/E29.345; 257/E29.346
(58) Field of Classification Search ................................. 257/E29.345–E29.346, 197
See application file for complete search history.

(56) References Cited

U.S. PATENT DOCUMENTS

| | | | |
|---|---|---|---|
| 5,861,638 A * | 1/1999 | Oh | 257/133 |
| 6,091,086 A * | 7/2000 | Zommer | 257/121 |
| 7,112,868 B2 | 9/2006 | Willmeroth et al. | |
| 7,470,952 B2 | 12/2008 | Ruething et al. | |
| 2001/0026977 A1 * | 10/2001 | Hattori et al. | 438/268 |
| 2003/0060014 A1 * | 3/2003 | Neidhart et al. | 438/270 |
| 2005/0017290 A1 * | 1/2005 | Takahashi et al. | 257/328 |
| 2005/0263852 A1 * | 12/2005 | Ogura et al. | 257/565 |

FOREIGN PATENT DOCUMENTS

DE   102005048447   4/2007

OTHER PUBLICATIONS

Fujihira, Tatsuhiko. "Theory of Semiconductor Superjunction Devices". Jpn. J. Appl. Phys. 36 (1997) pp. 6254-6262.*
"Superjunction FETs Boost Efficiency in PWMs" by Hancock. Published Jul. 1, 2005 in "Power Electronics Techology". Available at http://powerelectronics.com/mag/power_superjunction_fets_boost/.*
"Silicon Semiconductor Technology", Ulrich Hjlleringmann, 4th, Revised and Enlarged edition with 165 illustrations, 19 tables and 39 exercises, 2004.

* cited by examiner

*Primary Examiner*—A. Sefer
*Assistant Examiner*—Allen L Parker
(74) *Attorney, Agent, or Firm*—Dicke, Billig & Czaja, PLLC

(57) ABSTRACT

A semiconductor device and production method is disclosed. In one embodiment, the semiconductor device includes a first electrode and a second electrode, located on surfaces of a semiconductor body, and an insulated gate electrode. The semiconductor body has a contact groove for the first electrode in an intermediate oxide layer. Highly doped zones of a first conduction type are located in edge regions of the source connection zone. Below the highly doped zones of the first conduction type, there are highly doped zones of a body zone with a complementary conduction type. In a central region of the source connection zone, the body zone has a net charge carrier concentration with a complementary conduction type which is lower than the charge carrier concentration in the edge regions of the source connection zone.

19 Claims, 7 Drawing Sheets

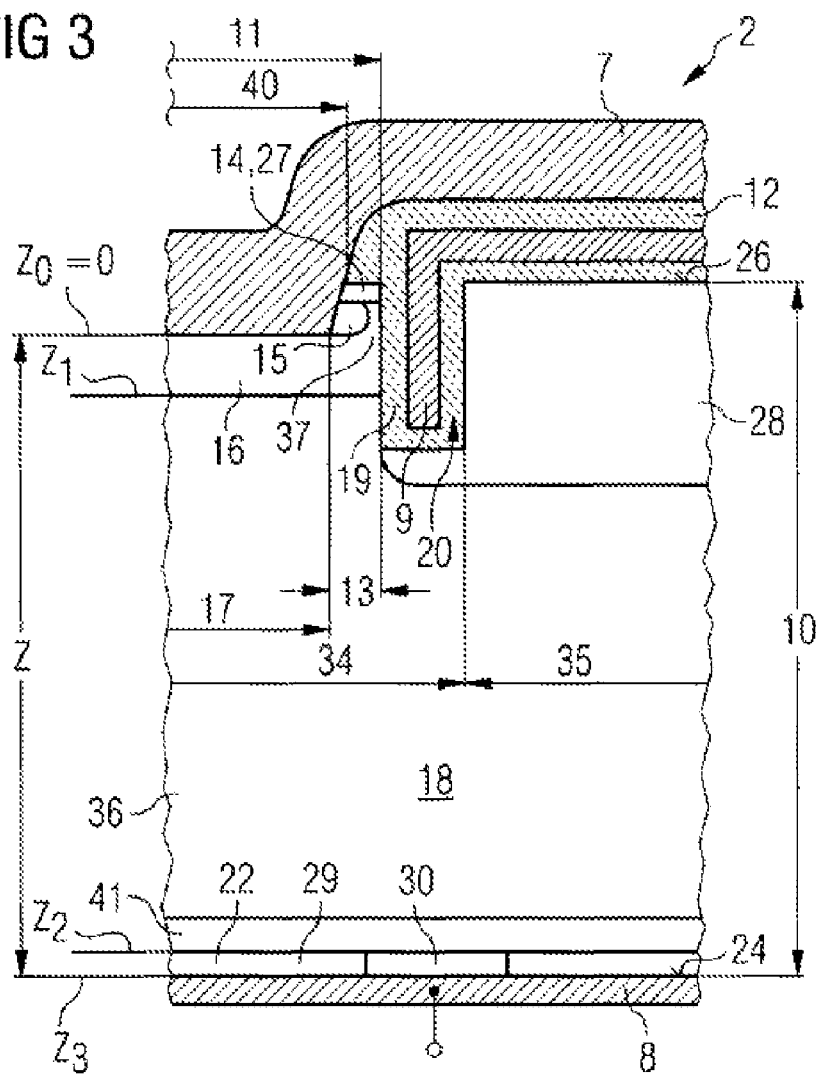
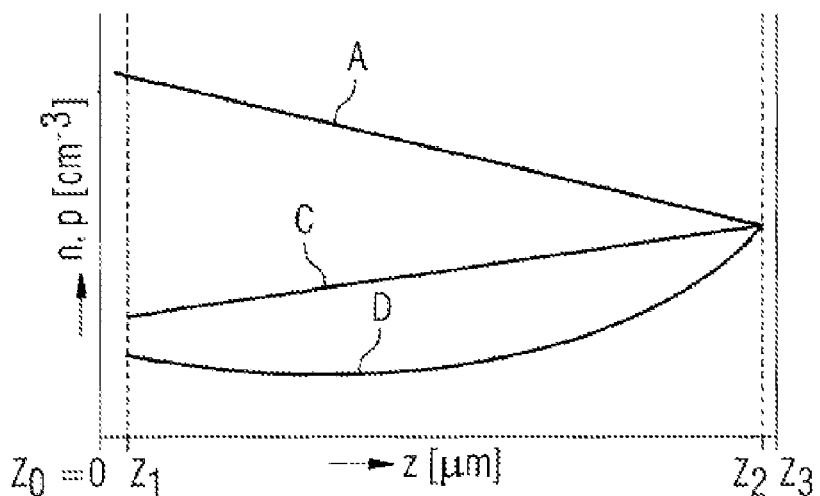

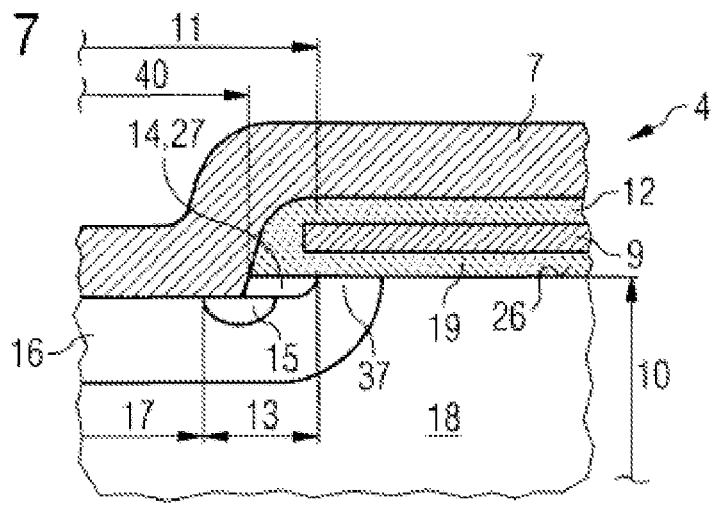
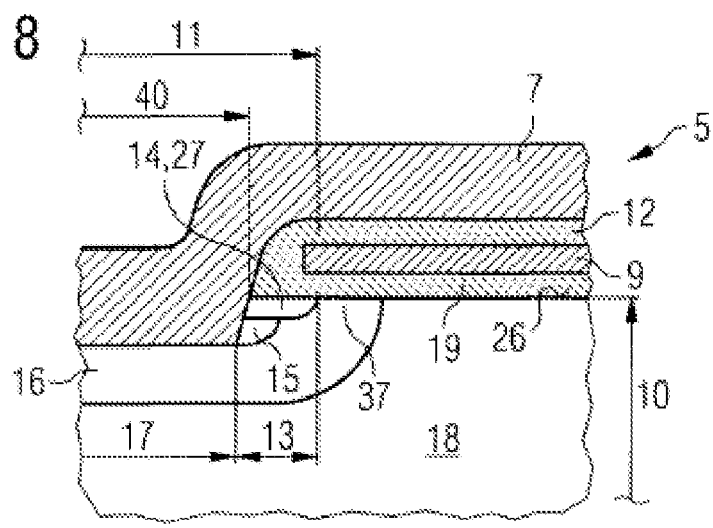
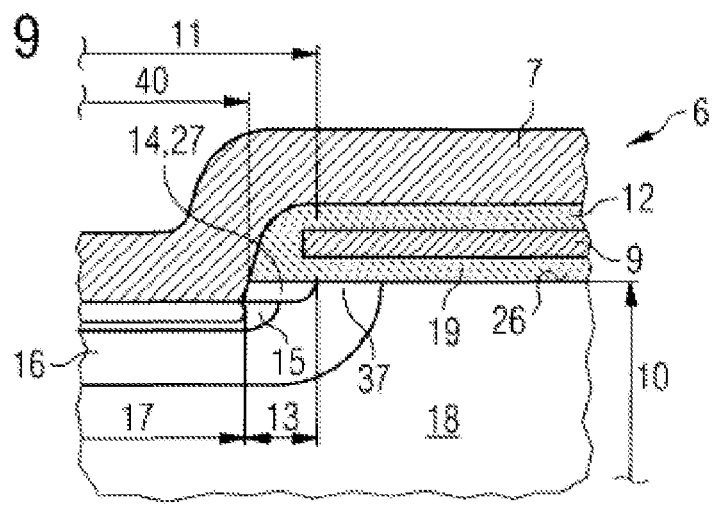

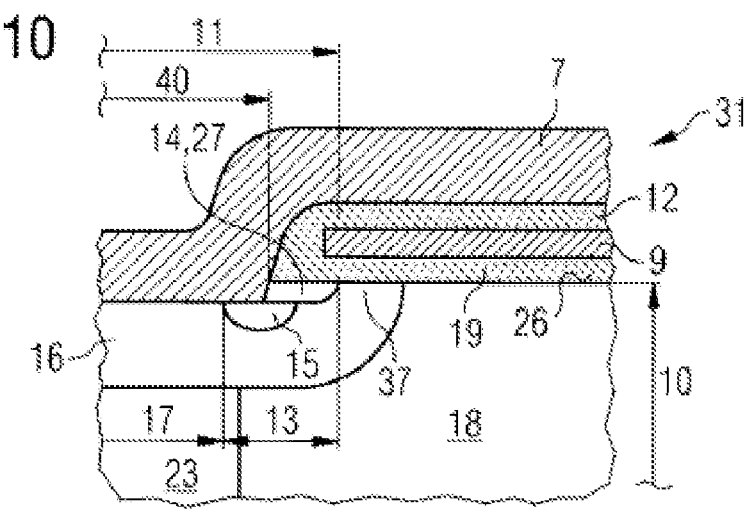
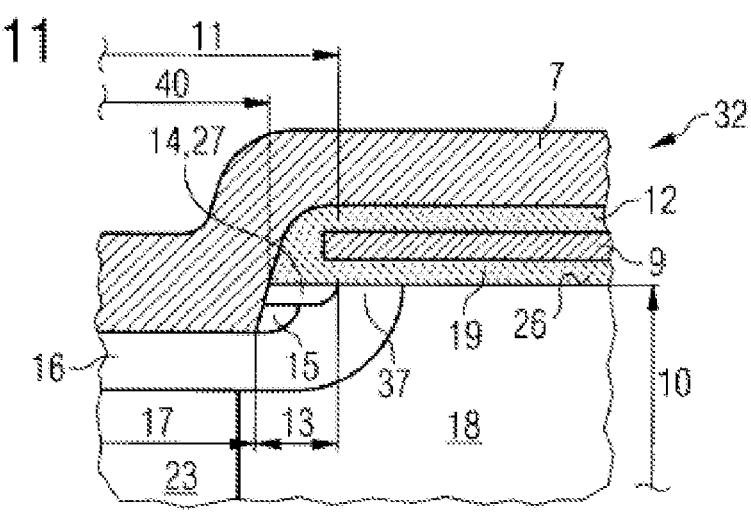
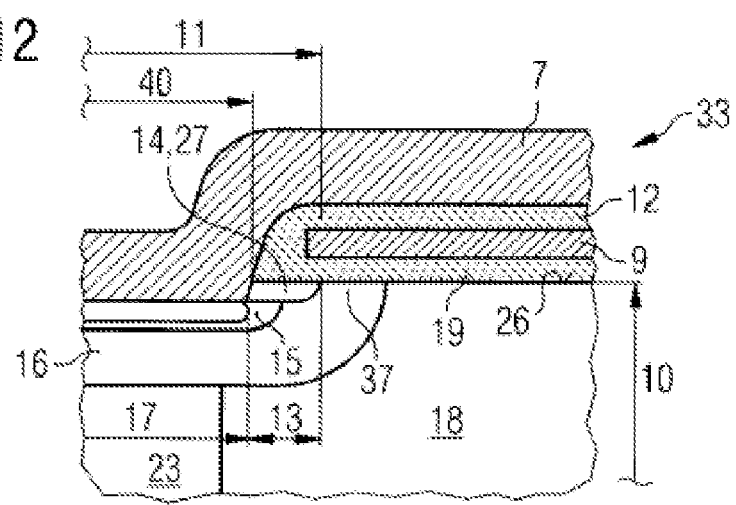

SEMICONDUCTOR DEVICE INCLUDING A FREE WHEELING DIODE

BACKGROUND

The invention relates to a semiconductor device and method for its production. For this purpose, the semiconductor device includes a first electrode and a second electrode located on surfaces of a semiconductor body and an insulated gate electrode. The semiconductor body has a contact groove for the first electrode in an intermediate oxide layer. Highly doped zones of a first conduction type are arranged in edge regions of the contact groove.

Highly doped zones of a complementary conduction type in the source connection zone act together with a highly doped emitter of a first conduction type of a monolithically integrated free wheeling diode. The concentration of doping material of these highly doped zones is higher by a power of ten than that in a body zone. These highly doped zones are located in the upper region of the body zone of a bipolar IGBT (insulated gate bipolar transistor) or a unipolar MOSFET. In the reverse mode of the semiconductor device, these highly doped zones determine the effect of the anode emitter of the free wheeling diode and result in a low forward voltage $V_F$ combined with a high stored charge in the semiconductor device.

In hard-switching applications, such a semiconductor device with a monolithically integrated free wheeling diode is less useful than a single diode solution with a switched-in free wheeling diode, because the reverse current peak, the diode switch-off energy and, in IGBT components, the IGBT switch-on energy are too high in a monolithically integrated free wheeling diode. As a result, the emitter efficiency of the complementary conduction type of the monolithically integrated free wheeling diode is too high, resulting in the flooding of the charge carrier in the drift zone, thus reducing the switching capacity of the component.

To reduce this flooding of the charge carrier, the life time of the charge carrier can be reduced locally or homogeneously, for example by irradiating a semiconductor wafer after its production with electrons or protons or by reducing the life time of the charge carrier in the semiconductor device by using rapid gold or platinum diffusion. This reduction of the life time of the charge carrier, however, has the disadvantage that not only the forward voltage $V_F$ but also the saturation forward voltage $V_{CEsat}$ between the first and second electrodes rises. With the rise of the forward or saturation voltage, power loss also increases owing to the heating of the semiconductor device in the forward mode, reducing the efficiency of the semiconductor device as a whole. The region bounded by the outer edges of the highly doped zones of a first conduction type is also referred to as source connection zone, because it includes a highly doped zone and a contact zone of the first (source) electrode with the body zone.

For these and other reasons, there is a need for the present invention.

SUMMARY

One embodiment provides a semiconductor device including a first electrode and a second electrode located on surfaces of a semiconductor body. The semiconductor device further includes an insulated gate electrode. For the first electrode, there are further provided a via on the semiconductor body in an intermediate oxide layer and a contact groove in the semiconductor body for the first electrode. The semiconductor body is provided with source connection zones for the first electrode, which extend to a channel region of a body zone. In central regions of the source connection zones, the semiconductor body has a net concentration of body zone doping material which is less than the concentration of doping material in edge regions of the source connection zones.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 3 is a diagrammatic cross-section through a semiconductor device.

FIG. 4 is a diagram illustrating the operation of the further embodiment according to FIG. 3.

FIG. 7 is a diagrammatic cross-section through a semiconductor device.

FIG. 8 is a diagrammatic cross-section through a semiconductor device.

FIG. 9 is a diagrammatic cross-section through a semiconductor device.

FIG. 10 is a diagrammatic cross-section through a semiconductor device.

FIG. 11 is a diagrammatic cross-section through a semiconductor device.

FIG. 12 is a diagrammatic cross-section through a semiconductor device.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
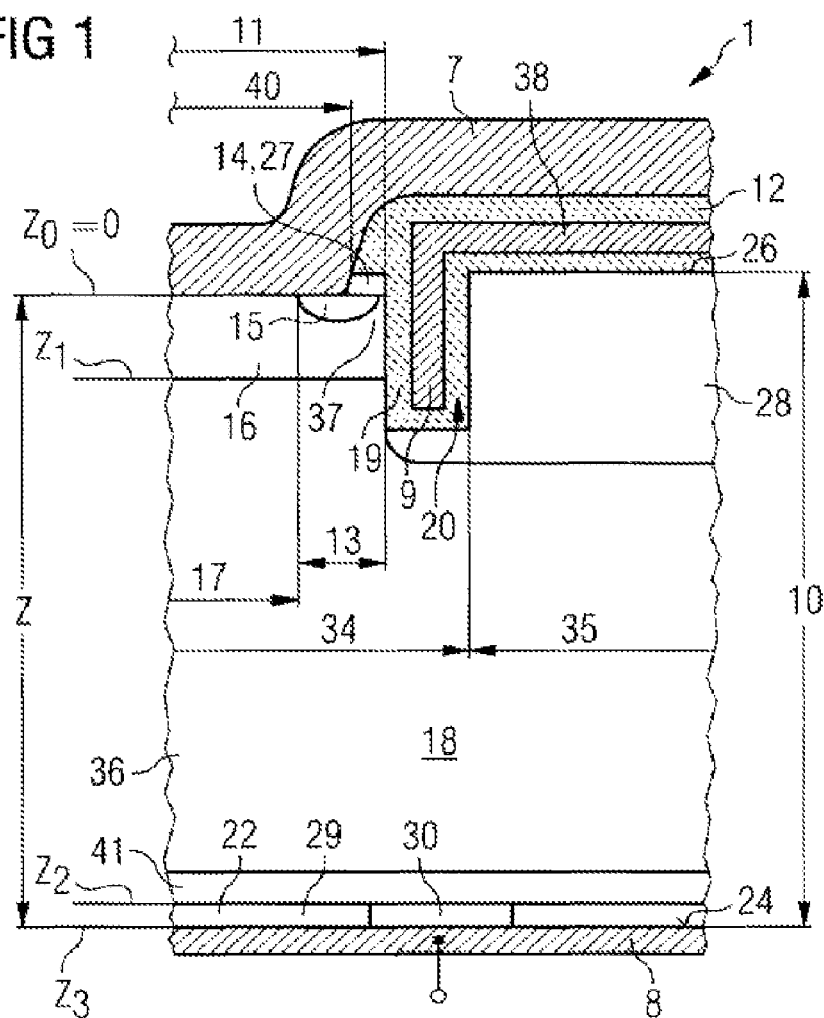
FIG. 1 is a diagrammatic cross-section through a semiconductor device.

FIG. 1 is a diagrammatic cross-section through part of a semiconductor device 1 of one embodiment. In this first embodiment, a first electrode 7 is formed by using applying a metallising layer to the surface 26 of a semiconductor body 10. The first electrode 7 is electrically insulated against an insulated gate electrode 9 likewise located on the surface 26 of the semiconductor body 10. A second electrode 8 is located on the rear side 24 of the semiconductor body 10.

In its rear region, the semiconductor body 10 has a highly doped connecting region 22, which in this embodiment, which is explained with reference to an IGBT (insulated gate bipolar transistor) semiconductor device, is a highly doped collector zone 29 of a complementary conduction type. This collector zone 29 of the complementary conduction type is partially interrupted by a highly doped emitter zone 30 of a first conduction type. While the highly doped collector zone 29 may extend laterally across the whole cell field of the IGBT illustrated in FIG. 1, the highly doped emitter zone 30 of the first conduction type covers a smaller area, as the emitter zone 30 only represents the cathode region of a monolithically integrated free wheeling diode. Vertically between the highly doped connecting region 22 and the drift zone 18, a field stop zone is provided which, although being of the same conduction type as the drift zone 18, is doped more highly than the drift zone 18 in order to stop the spread of the space-charge region before reaching the highly doped connecting region 22 in a reverse mode situation.

The semiconductor structure on the surface 26 of the semiconductor body 10 is more complex than the rear region 24 of the semiconductor body 10. An active cell structure 34 is at least partially surrounded by an edge region 35 in the near-surface region of the semiconductor body 10.

Between the rear side structure and the surface structure of the semiconductor body 10, a drift zone 18 is provided. This drift zone 18 has a low to medium doping and, like the highly doped collector zone 30, the first conduction type. A shielding zone 28 with complementary doping is provided in the edge region 35 in the near-surface region of the semiconductor body 10; this may extend below the insulated gate electrode 9.

In the active region, the semiconductor device includes a plurality of cells of which only a part can be seen in FIG. 1. Within the cells, the first electrode 7 contacts a low doped body zone 16 via a contact groove 40. The lateral region between the channel region 37 and the contact groove 40 is contacted laterally. In this region 39, highly doped zones 14 of the first conduction type are provided, which extend to a channel region 37 and are used as source zones 27.

In addition, the edge regions 13 are provided with highly doped regions 15 of the complementary conduction type outside of the channel region 37 of a body zone 16 below the highly doped zones 14 of the first conduction type. In the central region 17 of the contact groove 40, there is a region of the body zone 16, wherein the net concentration of doping material in the body zone 16 is lower than the concentration of doping material in the highly doped regions 15 in the edge regions 13 of the contact groove 40. As a result, the central region 17 and the channel region 37 together form a low doped body zone 16, with highly doped regions 15 restricted to the edge regions of the contact groove; these are sufficient to avoid a "latch-up" risk for the semiconductor device 1.

In addition, the highly doped regions 15 and the low doped regions 16 of the complementary conduction type, together with the highly doped collector zone 30 of the first conduction type in the rear region of the semiconductor body 10, form a monolithically integrated free wheeling diode for this IGBT.

In this embodiment, the semiconductor device 1 includes an insulated gate electrode 9 in a trench structure 20. Via a gate electrode conductor 38 in the intermediate oxide layer 12, this gate electrode 9 is supplied with varying potentials in the various switching states of the IGBT. The gate electrode conductor 38 is horizontal, while the gate electrode 9 is vertical. The gate electrode 9 extends from the highly doped zone 14 of the first conduction type via the channel region 37 of the less highly doped body zone 16 of the complementary conduction type to the drift zone 18 of the first conduction type. The vertical gate electrode 9 is insulated against the three zones 14, 16 and 18 by a gate oxide 19.

In place of the vertical gate structure of the illustrated embodiment, the IGBT may be driven by a laterally extending gate electrode as illustrated in FIGS. 7 to 12. As the body zone 16 is usually made first, followed by the incorporation of a highly doped zone of the same conduction type into the body zone 16 to avoid the "latch-up" risk, different sets of masks are provided for this embodiment of the invention in order to obtain different concentrations of doping material in the body zone 16 and thus different concentrations of doping material between the edge regions 13 and the central region 17.

A method for the production of a plurality of semiconductor chips for semiconductor devices 1 of the embodiment illustrated in FIG. 1 includes the following processes. First, a semiconductor wafer is structured from a monocrystalline semiconductor body 10 with semiconductor device structures in semiconductor chip positions to be provided with IGBTs. To introduce different charge carrier concentrations into a body zone to be contacted with an emitter electrode 7, the following further processes are carried out.

First, a body zone 16 with a complementary conduction type, which is self-adjusted relative to the trench structure 20, is incorporated into the semiconductor body 10. The implantation of the source zone 27 near the surface of the body zone is likewise carried out in a self-adjusting manner.

Using additional photographic technology, a higher concentration of doping material of the complementary conduction type is then introduced; this is laterally restricted to the edge region 13. The central region 17 of the body zone 16 therefore has a vertically integrated lower concentration of doping material than the edge region 13. An intermediate oxide 12 is applied, and a contact groove 40 is exposed in the intermediate oxide layer 12. The source zone 27 is therefore laterally restricted to the region 39 adjacent to the contact groove 40, while the depth of the contact groove 40 extends vertically as far as the body zone 16.

To connect the first electrode 7, the remaining intermediate oxide layer 12 and the contact groove 40 only have to be provided with a metal structure. In the cell region, the contact groove 40 may have a variety of forms, from circular contact connections via tetragonal or polygonal cells to strip-shaped cells 36 alternating with suitably insulated gate electrodes 9.

Further processes finally involve the alternate application of structured insulating layers and conductive layers, in order to fit first electrodes 7 filling the contact grooves 40 up to the body zone 16, second electrodes 8, which cover the rear side 24 of the semiconductor wafer, and insulated gate electrodes 9. The semiconductor wafer can then be divided into semiconductor chips and processed further to produce semiconductor devices.

Methods for the production of a plurality of semiconductor devices from a single semiconductor wafer are generally known and involve the production of a semiconductor wafer with a plurality of semiconductor chips for semiconductor devices, followed by the division of the semiconductor wafer into semiconductor chips and finally the mounting of the semiconductor chips on a chip carrier with a plurality of external contacts and semiconductor device positions.

The electrodes 7, 8 and 9 of the semiconductor chip are then connected to suitable contact surfaces in electrical contact with external contacts of the semiconductor device 1. Finally, a housing for the semiconductor device is fitted to enclose the individual semiconductor chips and the connecting elements, whereupon the circuit carrier is divided into individual semiconductor devices, in the present case IGBT devices with a monolithically integrated free wheeling diode.

Figure 2:
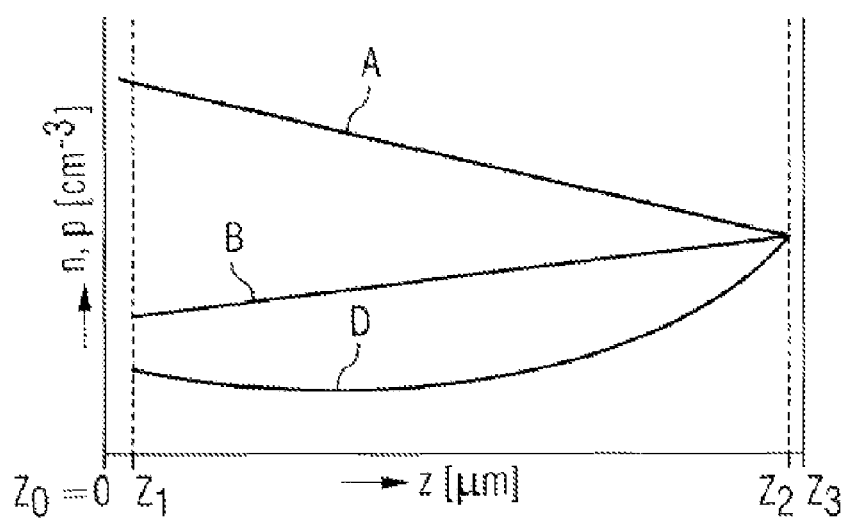
FIG. 2 is a diagram illustrating the operation of the first embodiment.

FIG. 2 is a diagram illustrating the operation of the first embodiment of the invention. The charge carrier concentration in $cm^{-3}$ for electrons or vias is plotted on the ordinate. The abscissa illustrates the penetration depth z in μm, with z=0 in the region of the surface 26 of the semiconductor body 10 as illustrated in FIG. 1, $z_1$ at the p-n junction between the body zone 16 and the drift zone 18, $z_2$ at the junction between the drift zone 18 and the highly doped connecting region 22 and finally $z_3$ at the rear side 24 of the semiconductor body 10 as illustrated in FIG. 1.

By way of comparison, Diagram A illustrates the behaviour of the charge carrier concentration of a conventional semiconductor device with a highly doped emitter in contact with the first electrode 7 according to FIG. 1. The charge carrier flooding is extremely high at $z_1$, decaying linearly towards $z_2$. There is no provision for homogeneously limiting the life of the charge carriers by using recombination centres in the drift zone. This behaviour can be observed in the diode mode or in the inverse mode of the IGBT with a monolithically integrated free wheeling diode. The highly doped complementary region 15 not illustrated in FIG. 1 covers the central region 17 of the body zone 16 as well.

The extremely high charge carrier flooding at $z_1$ is collected in the emitter in the diode state by the complementary and highly doped region completely surrounded by the body zone 16 and decays linearly in proportion to the penetration depth to the highly doped collector zone 30 of the first conduction type on the rear side 24 of the semiconductor body 10 at $z_2$.

Curve B illustrates the effect of the invention and the improvement obtained therefrom. As FIG. 1 illustrates, the central region 17 is free of a highly doped region of the complementary conduction type, and the first electrode 7 directly contacts the less highly doped body zone 16 in the central region 17. The charge carrier flooding near the surface is reduced significantly, particularly because the central region 17 of the body zone 16 no longer has a high concentration of doping material. The reduced charge carrier surplus slightly rises linearly towards $z_2$.

By reducing charge carrier flooding in the emitter region, a lower emitter efficiency is obtained, reducing the return current. The charge carrier flooding at the transition from a forward situation to a reverse situation can therefore decay faster and does no longer exist until the IGBT is restarted.

For comparison, Curve D illustrates the behaviour of the charge carrier concentration of a switched-in free wheeling diode with a homogeneous charge carrier life setting or charge carrier life reduction in the drift zone 18. Curve D can be superimposed on Curve B if, in addition to the low doping of the central region 17 of the body zone 16 according to FIG. 1, a homogeneous and/or local life reduction is carried out in the drift zone 18 of the semiconductor device 1 illustrated in FIG. 1.

In the case of Curve B, the masking used in the implantation of the highly doped regions 15 for the semiconductor device is changed such that there is no implantation in the centre of the body zone 16, resulting in the operation represented diagrammatically by Curve B. These curves were provided using process and device simulation.

FIG. 3 is a diagrammatic cross-section through a semiconductor device 2 according to a further embodiment of the invention. Components which are functionally identical to those of FIG. 1 are identified by the same reference numbers and not explained again. In this embodiment of the invention, the trench structure was retained and the structure of the rear side remains unchanged. The highly doped connecting region 22 on the rear side 24 of the semiconductor device 1 as illustrated in FIG. 1 can be implemented using a semiconductor substrate with high doping.

In an IGBT as illustrated in FIG. 3, a highly doped p-type semiconductor material is used as a substrate. A less highly doped semiconductor material is deposited on the substrate in an epitaxial process to form the drift zone 18. The doping of the substrate material complements that of the drift zone 18. In certain part-regions, however, it has the same conduction type as the drift zone, forming a highly doped collector zone 30 of a monolithically integrated free wheeling diode. As semiconductor substrates are too thick for this partial redoping, they are thinned before this process.

This semiconductor device 2 according to FIG. 3 differs from that illustrated in FIG. 1 in that the contact groove 40 in the cell structure 34 has a slightly more differentiated structure than the contact groove 40 of FIG. 1. In this differentiated structure, the highly doped region 15 in the edge region is completely located below the highly doped source zone 27, without the highly doped base region 15 reaching the channel region 37 of the body zone 16.

For a structure of this type, the production process can be simplified. As in the production of the semiconductor device 1 of FIG. 1, a low concentration of doping material for a complementary conduction type of a body zone 16 is introduced into the semiconductor body 10. A higher concentration of doping material for a complementary conduction type of a region 15 is then introduced. This is followed by the introduction of a high concentration of doping material for the first conduction type of a source zone. With this process, the following sequence of layers, starting from the surface 26, is created: a highly doped first conduction type followed by a highly doped complementary conduction type and finally by a low doped body zone region 16.

This sequence of layers has to be maintained in the edge regions 13 of the body zone 16. For this reason, the etching of a via in the intermediate oxide layer 12 is followed by a further process, wherein a contact groove 40 is etched into the semiconductor body 10, whereby the sequence of highly doped first conduction type in the central region 17 of the source connection zone 11 is removed. The contact groove 40 can then be refilled with metal for a first electrode 7.

All subsequent process processes remain the same, and it should be noted that, compared to the method for the production of a semiconductor device according to FIG. 1, this method offers the advantage that there is no need for a central cover and thus for an additional mask to incorporate the highly doped base zone regions 15 in the edge region 13 of the contact groove 40. It is therefore possible to use sets of masks which are already provided for structuring an IGBT with a highly doped zone preventing "latch-up" in the body zone.

FIG. 4 is a diagram illustrating the operation of the further embodiment according to FIG. 3. In contrast to a conventional IGBT with highly doped regions in the body zone to reduce the "latch-up" effect as illustrated by Curve A both in FIG. 2 and in FIG. 4, charge carrier flooding at the penetration depth $z_1$ is noticeably reduced as illustrated by curve C in the simulation of the semiconductor device and approaches, in regard of the behaviour of the charge carrier concentration, Curve D as illustrated in FIG. 2 and explained in detail with reference thereto. If charge carrier concentration is reduced homogeneously for a device with Curve C, a further reduction of charge carrier life can significantly reduce the reverse current peak when switching from the forward to the reverse mode.

Figure 5:
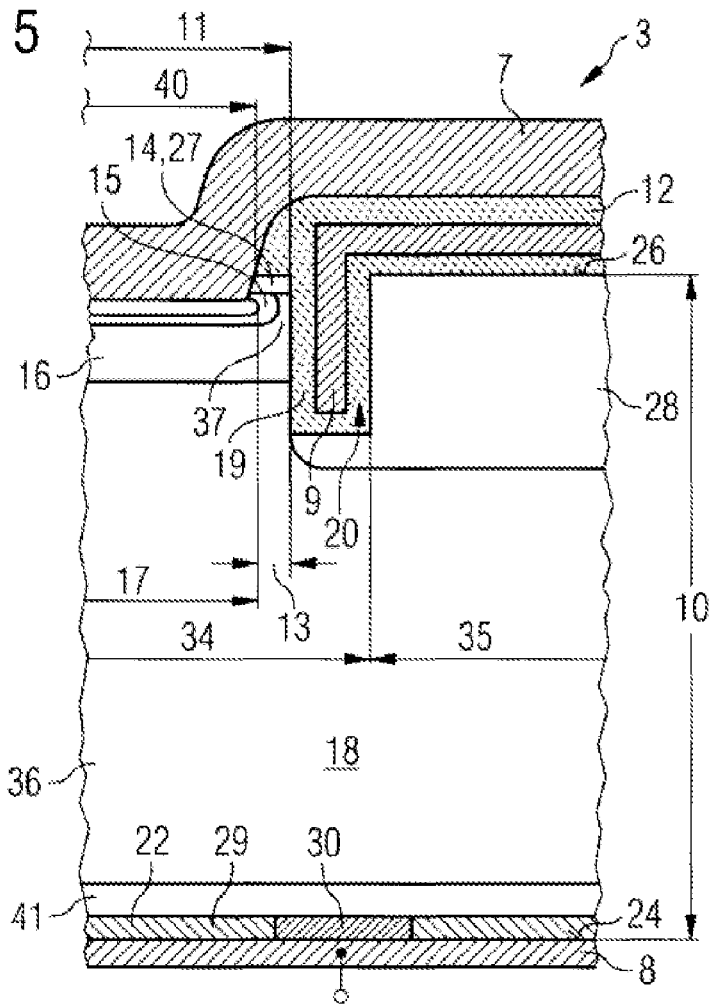
FIG. 5 is a diagrammatic cross-section through a semiconductor device.

FIG. 5 is a diagrammatic cross-section through a semiconductor device 3 according to a further embodiment. Components which are functionally identical to those of the preceding figures are identified by the same reference numbers and not explained again. This embodiment differs from the embodiments according to FIGS. 1 and 3 in that the reduction of charge carrier concentration in the central region 17 of the via window 111 is achieved by compensating the first produced highly doped region 15, in order to avoid the "latch-up" risk in the central region 17, by doping with a material of the first conduction type until, although a region of a complementary conduction type remains, a net charge carrier concentration is now available in the central region 17 which significantly reduces a charge carrier flooding of the emitter in the diode mode of the IGBT.

For this purpose, the production of the base zone 16 with the highly doped region 15 and the correspondingly highly doped source zone 27 is adjusted by introducing a lower concentration of doping material for a complementary conduction type of a body zone 16. This is followed by the introduction of a higher concentration of doping material for the complementary conduction type of the highly doped region 15. A high concentration of doping material is then introduced for a first conduction type of a source zone 27.

The contact groove is then etched, laterally exposing the region 27. The mask used in the etching process can then be used to introduce a doping material of the first conduction type into the highly doped region 15 of the body zone for a partial compensation of the complementary highly doped region 15 in the body zone 16 without effecting a re-doping. These various implantation processes eventually result in the semiconductor device 3 illustrated in FIG. 5.

Figure 6:
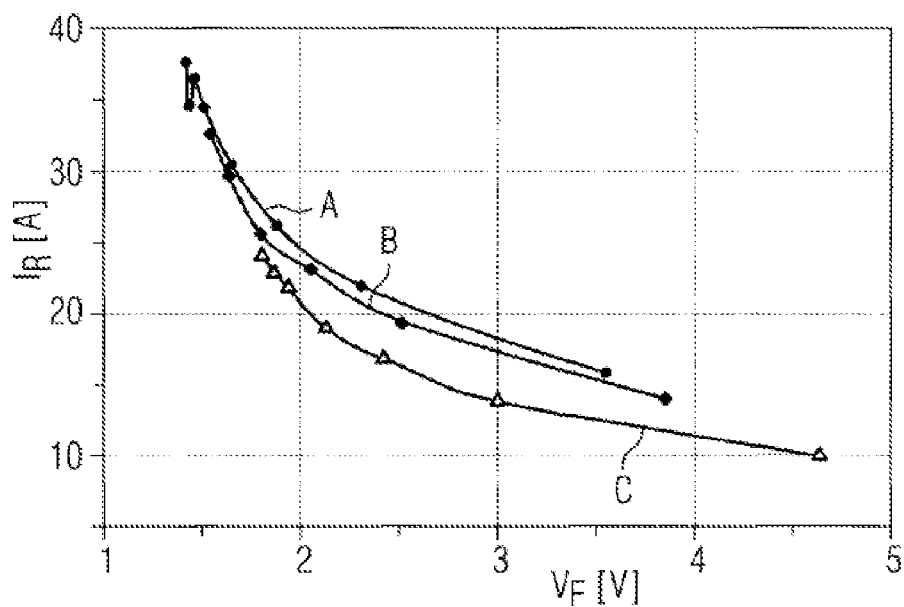
FIG. 6 is a diagram illustrating the operation of various embodiments.

FIG. 6 is a diagram illustrating the operation of various embodiments. The forward voltage in volts is plotted on the abscissa, which rises from 1.5 V to 4.5 V through recombination centres in the semiconductor body, depending on the way in which charge carrier life is reduced. The reverse current peak $I_R$ in amperes is plotted on the ordinate.

Even without any reduction in charge carrier life, the reverse current peak of Curve B in a semiconductor device 1 as illustrated in FIG. 1 is reduced by approximately 13% compared to the reference Curve A. In Curve C, where the contact groove is etched so deeply that the p⁺-region, as illustrated in FIG. 3 for a semiconductor device 2, is completely removed below the via, peak current can be reduced by as much as 35% compared to the reference Curve A. For both variants with Curves B and C, the change in stored charge was simulated as well. It reacts slightly more strongly than the reverse current peak, which is however not illustrated here.

The invention can be applied to other devices including an integrated inverse diode, such as DMOS power transistors or a trench-MOS power transistor (known under the trade names CoolMOS or SFET), which are illustrated in the following figures. Both in the IGBTs illustrated in FIGS. 1 to 3 and in the MOS transistors illustrated in the following figures, the gate electrode 9 may be designed either as a vertical trench gate as illustrated in FIGS. 1 to 3 or as a lateral planar gate as illustrated in the following figures, and the cells 36 of the cell structure 34 may be square, strip-shaped or polygonal.

FIG. 7 is a diagrammatic cross-section through a semiconductor device 4 according to a further embodiment of the invention. This semiconductor device 4 is a DMOS transistor with a lateral gate structure. This semiconductor device 4 likewise requires the first electrode 7 to be connected to a source zone 27, a body zone 16 and a highly doped region 15 at the edge of the source connection zone 11 via a contact groove 40. The structure of the contact groove 40 corresponds to that illustrated in FIG. 1. Accordingly, any charge carrier flooding is significantly reduced in the diode mode of the semiconductor device 4, in particular since the highly doped region 15 of the body zone 16 is noticeably reduced and high doping for this body zone region 15 is restricted to the edge regions 13 of the source connection zone 11.

FIG. 8 is a diagrammatic cross-section through a semiconductor device 5 according to a further embodiment, wherein the structure of the surface 26 of the semiconductor body 10 corresponds to that of the surface 26 of the semiconductor body 10 according to FIG. 3. By using a suitable etching process, the source connection zone 11 reaches the low doped base zone 16 in the central region 17. As a result, two superimposed highly doped zones of a material of a complementary conduction type and a material of a first conduction type remain only in the edge regions 13 of the contact groove. The operation of this structure corresponds to Curves C in FIGS. 2 and 4, offering a significant reduction in charge carrier flooding and a corresponding reduction in emitter efficiency.

FIG. 9 is a diagrammatic cross-section through a semiconductor device 6 according to a further embodiment, wherein, in accordance with the structure illustrated in FIG. 5, a compensation doping of the central region 17 of the source connection zone 11 is carried out. This embodiment differs from FIG. 5 only in that it features a lateral gate structure. In the compensation doping process by n⁺-ion implantation through the via into the p⁺-region, it has to be ensured that there is no re-doping following the diffusion. This can be achieved by adjusting the implantation dose and the temperature budget to obtain an effective doping material compensation reduced compared to the previously introduced p⁺-doping.

FIGS. 10, 11 and 12 illustrate semiconductor devices 31, 32 and 33 of an IGBT or MOSFET with a lateral gate structure, wherein the surface structure of the semiconductor body 10 corresponds to that of the semiconductor devices 4 to 6 illustrated in FIGS. 7, 8 and 9. In addition to the lateral gate structure, these semiconductor devices 7 to 9 include charge carrier compensation zones 23 of the complementary conduction type in the drift zone 18. These charge carrier compensation zones 23 extend from the base zone 16 to the proximity of the highly doped connecting region 22 illustrated in FIGS. 1, 3 and 5. The highly doped connecting region not illustrated here includes a highly doped substrate of the first conduction type, in contrast to the semiconductor devices 1 to 3.

Figure 13:
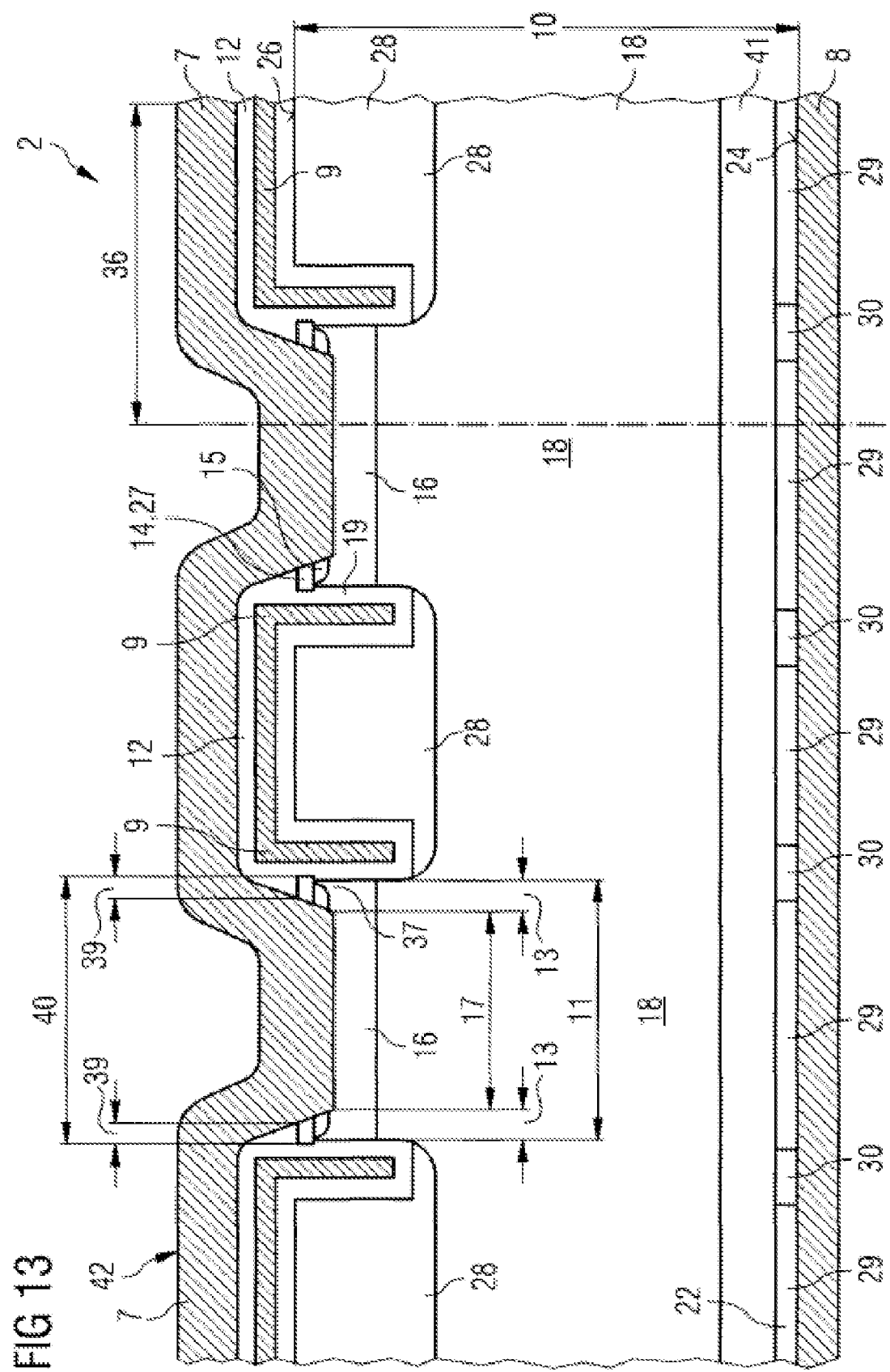
FIG. 13 is a diagrammatic cross-section through a cell region of the embodiment according to FIG. 3.

FIG. 13 is a diagrammatic cross-section through a cell region 42 of the embodiment according to FIG. 3. The individual cell 36 is structured as illustrated in FIG. 3. In order to illustrate the principal structure of a cell region 42, the cells 36 are arranged adjacent to one another in mirror image fashion, shielding zones 28 alternating with active cell structures 34 in the cell region 42. In this embodiment according to FIG. 13, the region of the rear side 24 of the semiconductor body 10 includes, at the junction from the drift zone 18 to the highly doped connecting region 22, a field stop zone 41 of the same conduction type as the drift zone 18, the field stop zone 41 being doped more highly than the drift zone 18.

In this embodiment according to FIG. 13, the highly doped connecting zone 22 is provided for each cell 36 with a highly doped collector zone 29 of a complementary conduction type and in addition with a highly doped emitter zone 30 of a first conduction type, which represents the cathode of the monolithically integrated free wheeling diode. As FIG. 14, however, indicates, this cathode region 30 does not have to be provided for each cell 36 in a cell region 42 of a semiconductor device.

Figure 14:
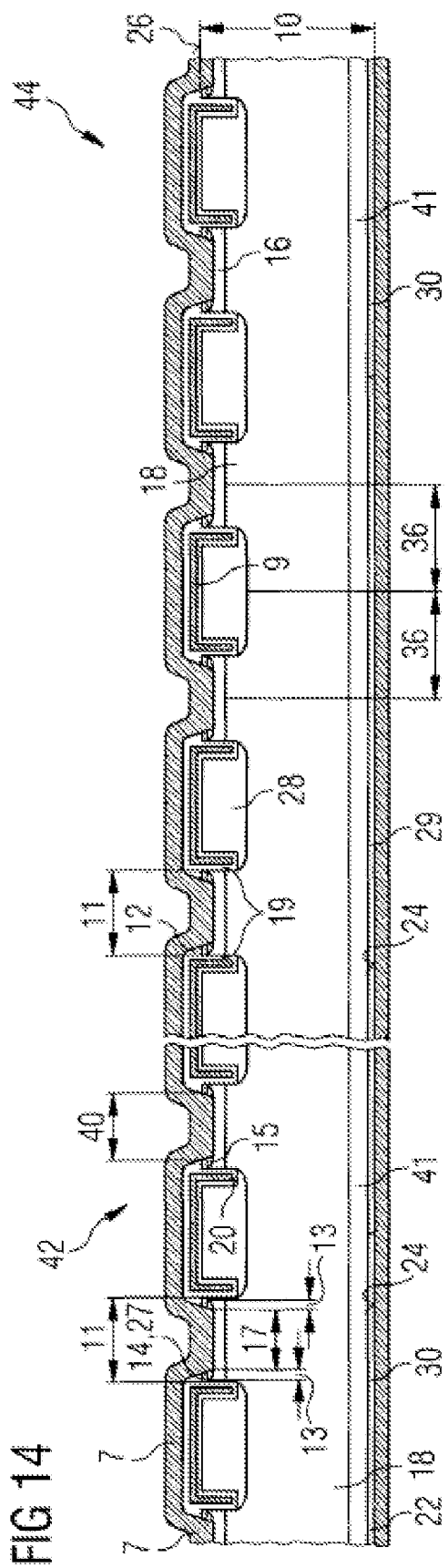
FIG. 14 is a diagrammatic cross-section through a cell region.

FIG. 14 is a diagrammatic cross-section through a cell region 42 of a semiconductor device 44 according to a further embodiment. In this embodiment, the cell region 42 is constructed of individual cells 36 arranged adjacent to one another. The highly doped connecting region 22, however, is structured such that a plurality of cells 36 acts together with a highly doped collector zone 29 of a complementary conduction type. Other cells 36, which in FIG. 14 are located at the edges of the illustrated section of a semiconductor device 44, are provided with connecting regions with highly doped emitter zones 30 of a first conduction type on the rear side.

This arrangement improves the gating behaviour of the illustrated IGBT. Functionally identical components are identified by the same reference number as in the preceding figures and not specially explained. On the other hand, no or only a few shielding zones 28 may be provided in the cell region 42, in particular in semiconductor devices with trench gate structures as illustrated in FIG. 14. In these cases, the source connection zones 22 may be located on both sides of the trench gate structure.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   a first electrode located on a front surface of a semiconductor body;
   a second electrode, located on a rear surface of the semiconductor body;
   an insulated gate electrode;
   a via on the semiconductor body in an intermediate oxide layer for the first electrode;
   wherein the semiconductor body comprises:
   an edge region of a source connection zone with a highly doped zone of a first conduction type,
   wherein the highly doped zone extends to a channel region of a body zone with a conduction type complementary to the first conduction type,
   a central region of the source connection zone with the complementary conduction type
   a monolithically integrated free wheeling diode;
   a highly doped region of the complementary conduction type outside of the channel region of the body zone which is located below the highly doped zone of the first conduction type and laterally adjacent to the central region of the source connection zone such that the central region of the source connection zone directly contacts a low doped region of the body zone,
   wherein the central region has a net concentration of doping material of the complementary conduction type which is lower than the concentration of doping material of the highly doped region,
   wherein the highly doped region is an anode of the monolithically integrated free wheeling diode; and
   a highly doped connecting region in a rear region located on the second electrode has a highly doped collector zone of the complementary conduction type,
   wherein the highly doped collector zone of the complementary conduction comprises an opening,
   wherein a highly doped emitter zone of said first conduction type is arranged in the opening,
   wherein the highly doped emitter zone covers a smaller area than the highly doped collector zone, and
   wherein the emitter zone is a cathode of said monolithically integrated free wheeling diode.

2. The semiconductor device of claim 1,
   wherein the insulated gate electrode is located in the intermediate oxide layer and extends laterally from the highly doped zone to a drift zone of the first conduction type via a less highly doped body zone of the complementary conduction type, and
   wherein the gate electrode is insulated by a gate oxide from the highly doped zone, the drift zone, and the less highly doped zone.

3. The semiconductor component of claim 1,
   wherein the insulated gate electrode is located in a trench structure and extends vertically from the highly doped zone to a drift zone of the first conduction type via a less highly doped body zone with the complementary conduction type,
   wherein the gate electrode is insulated by a gate oxide from the highly doped zone, the drift zone, and the less highly doped body zone.

4. The semiconductor device of claim 2,
   wherein the drift zone extends from the body zone to a highly doped connecting region of the semiconductor body,
   which is contacted by the second electrode.

5. The semiconductor device of claim 4,
   wherein at least a portion of the connecting region has the complementary conduction type.

6. The semiconductor device of claim 4,
   wherein at least a portion of the connecting region has the first conduction type.

7. The semiconductor device of claim 2,
   wherein the drift zone includes charge compensation zones with the complementary conduction type.

8. The semiconductor device of claim 4, wherein a field stop zone with a higher concentration of doping material of the first conduction type than the drift zone is located between the connecting region and the drift zone.

9. The semiconductor device of claim 1,
   wherein a contact groove extends into the semiconductor body, and
   wherein an adjusted etching depth of the contact groove for the first electrode includes varying concentrations of doping material of the complentary conduction type between the edge region and the central region of the source connection zone.

10. The semiconductor device of claim 1,
    wherein different concentrations of doping material of the complementary conduction type are arranged in the region of the body zone resulting in varying concentrations of doping material between the edge region and the central region of the source connection zone.

11. The semiconductor device of claim 1,
    wherein a partial compensation of the charge carriers in the central region of the source connection zone includes varying concentrations of doping material of the complementary conduction type between the edge region and the central region of the source connection zone.

12. The semiconductor device of claim 4,
wherein regions of the complementary conduction type alternate with regions of the first conduction type in the connecting region, and
wherein the regions of each conduction type are arranged adjacent to one another in a cell region of the semiconductor device.

13. The semiconductor device of claim 4,
wherein a plurality of additional cells in a cell region of the semiconductor device each include
a collector zone of the complementary conduction type in the connecting region, and
wherein the additional cells of the cell region each include a highly doped emitter zone of the first conduction type.

14. The semiconductor device of claim 1, wherein the semiconductor device is a power transistor.

15. The semiconductor device of claim 1, wherein the semiconductor device is an IGBT (insulated gate bipolar transistor).

16. The semiconductor device of claim 1, wherein the semiconductor device is a DMOS transistor.

17. The semiconductor device of claim 1, wherein the semiconductor device is a superjunction MOSFET transistor.

18. The semiconductor device of claim 1, wherein the semiconductor device is a trench MOSFET.

19. The semiconductor component of claim 1, further comprising
a plurality of cells, and
wherein each cell of the semiconductor device comprises a monolithically integrated free wheeling diode.

* * * * *